(12) United States Patent
Yosui

(10) Patent No.: US 11,075,092 B2
(45) Date of Patent: Jul. 27, 2021

(54) MULTI-LAYER SUBSTRATE

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/296,280

(22) Filed: Mar. 8, 2019

(65) Prior Publication Data
US 2019/0206700 A1 Jul. 4, 2019

Related U.S. Application Data

(63) Continuation of application No. PCT/JP2017/038169, filed on Oct. 23, 2017.

(30) Foreign Application Priority Data

Oct. 27, 2016 (JP) .............................. JP2016-210941

(51) Int. Cl.
| | |
|---|---|
| *H05K 1/11* | (2006.01) |
| *H05K 1/03* | (2006.01) |
| *H01L 21/48* | (2006.01) |
| *H01L 23/498* | (2006.01) |
| *H05K 3/40* | (2006.01) |

(Continued)

(52) U.S. Cl.
CPC ...... *H01L 21/4857* (2013.01); *H01L 21/4867* (2013.01); *H01L 23/145* (2013.01);
(Continued)

(58) Field of Classification Search
CPC .......... H01L 21/4857; H01L 23/49822; H01L 23/49894; H01L 23/49838; H01L 21/4867;
(Continued)

(56) References Cited

U.S. PATENT DOCUMENTS

| | | | |
|---|---|---|---|
| 9,012,785 B2* | 4/2015 | Otsubo | H05K 1/0313 174/254 |
| 2002/0053465 A1 | 5/2002 | Kawakita et al. | |

(Continued)

FOREIGN PATENT DOCUMENTS

| | | |
|---|---|---|
| JP | 56-69893 A | 6/1981 |
| JP | 05-335747 A | 12/1993 |

(Continued)

OTHER PUBLICATIONS

Official Communication issued in International Patent Application No. PCT/JP2017/038169, dated Jan. 23, 2018.

*Primary Examiner* — Ishwarbhai B Patel
(74) *Attorney, Agent, or Firm* — Keating & Bennett, LLP

(57) ABSTRACT

A multi-layer substrate includes a first base material layer made of an insulating material, a first interlayer connection conductor provided in the first base material layer, an insulating layer, a second base material layer made of an insulating material and facing the first base material layer across the insulating layer, and a second interlayer connection conductor provided in the second base material layer and joined with the first interlayer connection conductor. The insulating layer is made of an insulation sheet on which no conductor pattern is provided. The insulation sheet includes an opening around a joining surface between the first interlayer connection conductor and the second interlayer connection conductor. The first interlayer connection conductor and the second interlayer connection conductor are joined with each other through the opening.

17 Claims, 6 Drawing Sheets

(51) Int. Cl.
*H01L 23/14* (2006.01)
*H05K 3/46* (2006.01)

(52) U.S. Cl.
CPC .. *H01L 23/49822* (2013.01); *H01L 23/49838* (2013.01); *H01L 23/49894* (2013.01); *H05K 1/11* (2013.01); *H05K 1/111* (2013.01); *H05K 3/40* (2013.01); *H05K 3/46* (2013.01); H05K 1/0313 (2013.01)

(58) Field of Classification Search
CPC .......... H01L 23/145; H05K 3/46; H05K 3/40; H05K 1/11
See application file for complete search history.

(56) References Cited

U.S. PATENT DOCUMENTS

| | | |
|---|---|---|
| 2004/0142161 A1 | 7/2004 | Kawakita et al. |
| 2007/0018313 A1* | 1/2007 | Gomyo ................ H01L 21/568 257/723 |
| 2008/0128911 A1* | 6/2008 | Koyama .............. H05K 3/4688 257/759 |
| 2013/0127560 A1* | 5/2013 | Kato .................... H05K 1/0253 333/12 |
| 2014/0098501 A1* | 4/2014 | Kawaguchi .......... H05K 1/0277 361/750 |
| 2017/0232250 A1* | 8/2017 | Kim ........................ A61B 5/04 607/116 |

FOREIGN PATENT DOCUMENTS

| | | |
|---|---|---|
| JP | 08-37375 A | 2/1996 |
| JP | 2002-094200 A | 3/2002 |
| JP | 2003-347454 A | 12/2003 |
| JP | WO 2007/043438 * | 4/2007 |
| JP | 2007-134509 A | 5/2007 |
| JP | 2016-025284 A | 2/2016 |
| WO | 2012/074100 A1 | 6/2012 |

* cited by examiner

MULTI-LAYER SUBSTRATE

CROSS REFERENCE TO RELATED APPLICATIONS

This application claims the benefit of priority to Japanese Patent Application No. 2016-210941 filed on Oct. 27, 2016 and is a Continuation Application of PCT Application No. PCT/JP2017/038169 filed on Oct. 23, 2017. The entire contents of each application are hereby incorporated herein by reference.

BACKGROUND OF THE INVENTION

1. Field of the Invention

The present invention relates to a multi-layer substrate including insulating base material layers that are stacked and a method of manufacturing the same.

2. Description of the Related Art

In a conventional multi-layer substrate including an interlayer connection conductor, an interlayer connection conductor formed by solidifying conductive paste is used. The structure and material of the interlayer connection conductor are designed in consideration of increasing the density of a wiring pattern of the multi-layer substrate and the mounting property of an electronic component on the surface thereof.

For example, Japanese Patent Laid-open No. 5-335747 discloses a ceramic multi-layer substrate suitable for flip-chip mounting of a semiconductor element.

In a heat pressing process during manufacturing of a multi-layer substrate, conductive paste for forming an interlayer connection conductor is ejected due to gas generation from the conductive paste in some cases. In particular, as described in Japanese Patent Laid-open No. 5-335747, when interlayer connection conductors continuous in the stacking direction are included in a multi-layer substrate, the conductive paste is likely to be ejected from the portion in which interlayer connection conductors become continuous.

When the conductive paste is ejected, the ejected conductive paste is solidified to form a conductor portion. This generates unnecessary capacitance between the conductor portion and another circuit pattern or form a short circuit between conductive patterns through the conductive portion in some cases. Thus, it is difficult to obtain predetermined electrical characteristics.

SUMMARY OF THE INVENTION

Preferred embodiments of the present invention provide multi-layer substrates each having a structure that reduces ejection of conductive paste from a portion in which interlayer connection conductors become continuous in the stacking direction at heat pressing, and a method of manufacturing the same.

A multi-layer substrate according to a preferred embodiment of the present invention includes a first base material layer that is made of an insulating material; a first interlayer connection conductor provided in the first base material layer; an insulating layer; a second base material layer that is made of an insulating material and faces the first base material layer across the insulating layer; and a second interlayer connection conductor provided in the second base material layer and joined with the first interlayer connection conductor, wherein the insulating layer is made of insulating resin on which no conductor pattern is provided, defines a layer interface including a joining surface at which the first interlayer connection conductor and the second interlayer connection conductor are joined with each other, and includes an opening provided around the joining surface.

With the above-described configuration, the opening in the insulating layer defines a space, and thus, filling rates of holes of the first interlayer connection conductor and the second interlayer connection conductor are decreased. Thus, when gas, such as a volatile component of a solvent, is generated from the first interlayer connection conductor and the second interlayer connection conductor, ejection of conductive paste from portions at which the first interlayer connection conductor and the second interlayer connection conductor are provided is reduced.

It is preferable that the diameter of the opening is larger than the diameter of the first interlayer connection conductor and the diameter of the second interlayer connection conductor. With this configuration, the filling rates of holes of the first interlayer connection conductor and the second interlayer connection conductor are further decreased, thus effectively reducing conductive paste ejection.

It is preferable that the insulating layer has greater permeability to gas than that of the first base material layer and the second base material layer. With this configuration, gas generated from the first interlayer connection conductor and the second interlayer connection conductor is more likely to escape, thus further reducing conductive paste ejection.

It is preferable that the insulating layer is exposed at an end surface of a stacked body of a plurality of base material layers including the first base material layer and the second base material layer. With this configuration, gas released from the first interlayer connection conductor and the second interlayer connection conductor escapes in a plane direction through the insulating layer, and thus is likely to exit the multi-layer substrate. Accordingly, the gas is more likely to escape, thus further reducing conductive paste ejection.

It is preferable that the thickness of the insulating layer is smaller than the thickness of the first base material layer and the thickness of the second base material layer. Accordingly, the thickness of the multi-layer substrate is reduced, which provides a chip component having a reduced height.

It is preferable that the insulating layer is made of the same or substantially the same base material as a base material of the first base material layer and the second base material layer and includes a smaller amount of filler than the first base material layer and the second base material layer. Accordingly, the sticking force between the first base material layer and the insulating layer, and the sticking force between the insulating layer and the second base material layer are maintained.

It is preferable that the first base material layer and the second base material layer each include liquid crystal polymers as a primary component, and the insulating layer includes epoxy or polyimide as a primary component. Accordingly, the multi-layer substrate having high-temperature heat resistance of the first base material layer and the second base material layer and high permeability of the insulating layer to gas is able to be obtained.

The first interlayer connection conductor and the second interlayer connection conductor are made of, for example, conductive paste including Sn. Sn has a low melting point, and thus conductive paste including Sn as a primary component is more likely to be ejected at heat pressing. Under such a condition, ejection of the conductive paste is reduced. In addition, for example, the first base material layer and the second base material layer are made of a resin base material, and the first interlayer connection conductor and the second interlayer connection conductor solidify during heat pressing after stacking. Accordingly, the multi-layer substrate including the interlayer connection conductors is able to be easily manufactured.

A multi-layer substrate manufacturing method according to a preferred embodiment of the present invention includes a through-hole formation step of forming a first through-hole in a first base material layer that is made of an insulating material, and forming a second through-hole in a second base material layer that is made of an insulating material; a conductive paste filling step of filling the first through-hole and the second through-hole with conductive paste; an insulating layer formation step of forming, in contact with the first base material layer or the second base material layer, an insulating layer made of insulating resin on which no conductor pattern is formed and including an opening formed around the first through-hole and the second through-hole in plan view; and a stacked body formation step of stacking and bonding by heat pressing a plurality of base material layers including the first base material layer and the second base material layer, and forming a first interlayer connection conductor from the conductive paste in the first through-hole and forming a second interlayer connection conductor from the conductive paste in the second through-hole.

According to the above-described manufacturing method, ejection of conductive paste from portions at which the first interlayer connection conductor and the second interlayer connection conductor are formed is reduced, so that the first interlayer connection conductor and the second interlayer connection conductor have desired shapes, thus achieving a multi-layer substrate having a predetermined electrical characteristic.

According to preferred embodiments of the present invention, ejection of conductive paste from portions at which a first interlayer connection conductor and a second interlayer connection conductor are provided is reduced. This prevents generation of unnecessary capacitance between a conductor portion provided through solidification of the ejected conductive paste and another circuit pattern, and preventing a short-circuit between conductor patterns through the conductor portion, thus achieving a multi-layer substrate having a predetermined electrical characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the accompanying drawings.

First Preferred Embodiment

Figure 1:
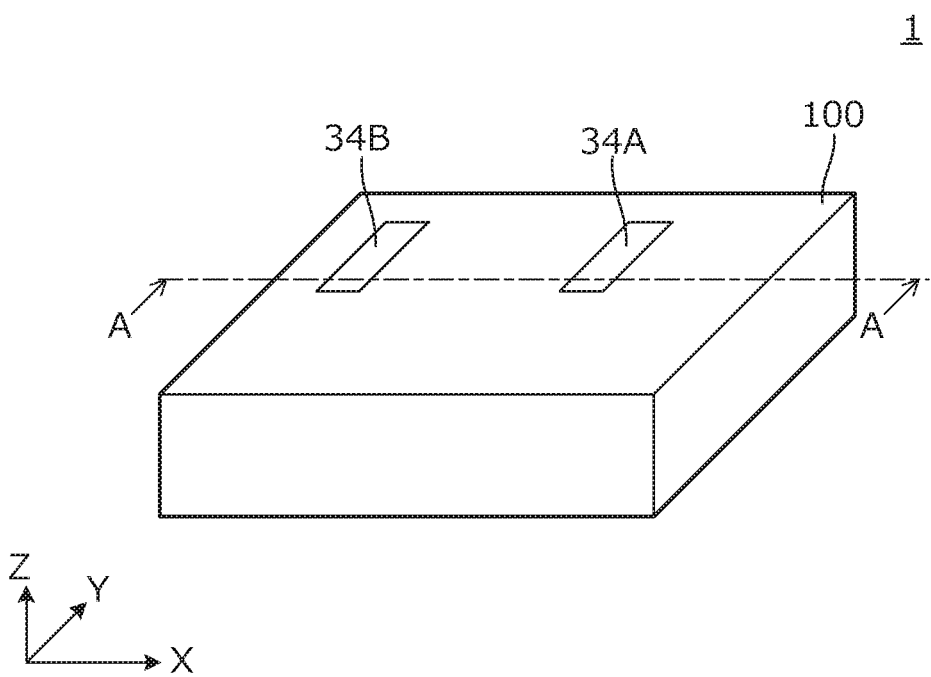
FIG. 1 is a perspective view of a multi-layer substrate according to a first preferred embodiment of the present invention.
Figure 2:
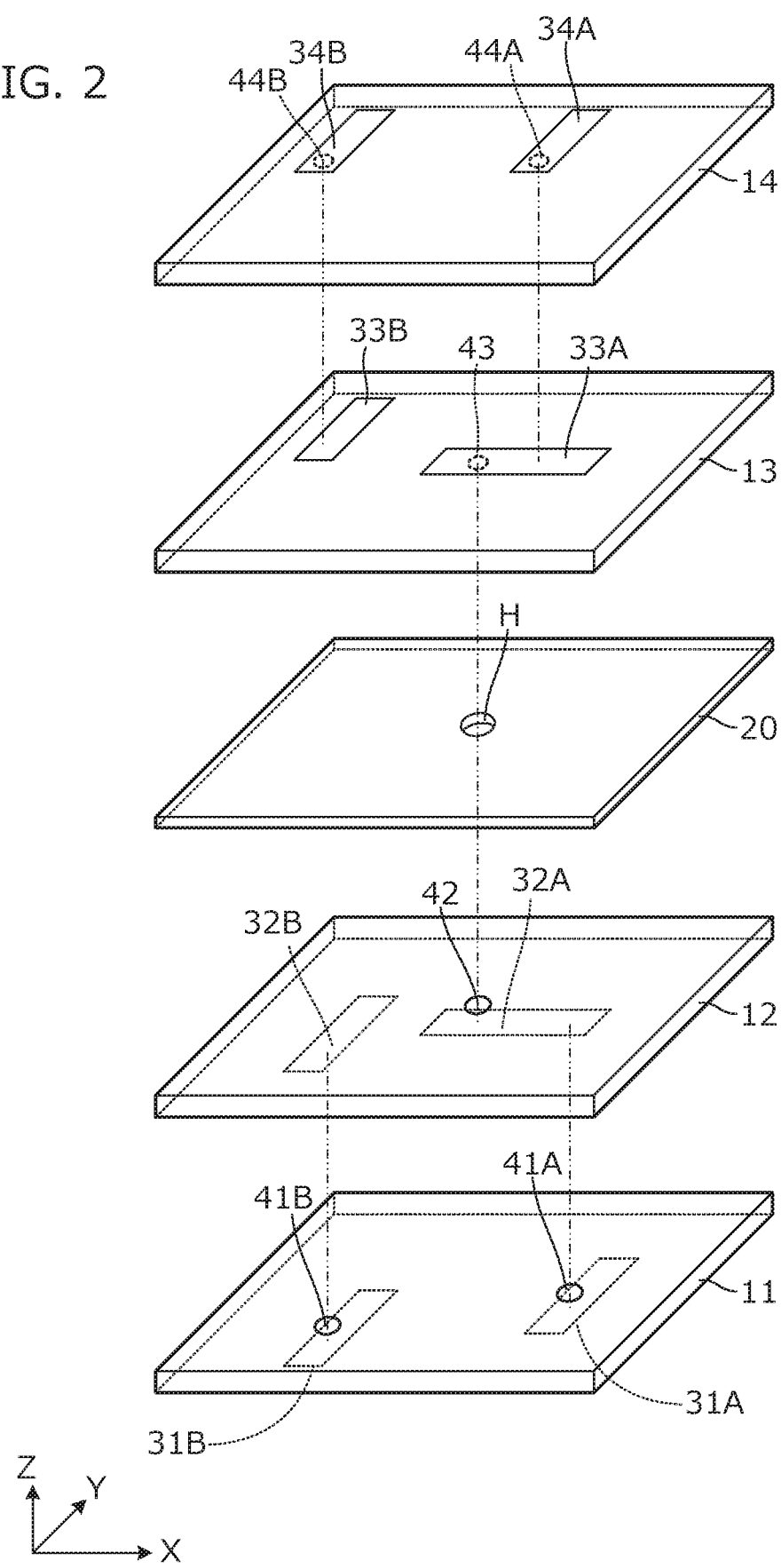
FIG. 2 is a perspective view of a state of the multi-layer substrate 1 illustrated in FIG. 1 before layers are stacked.
Figure 3A:
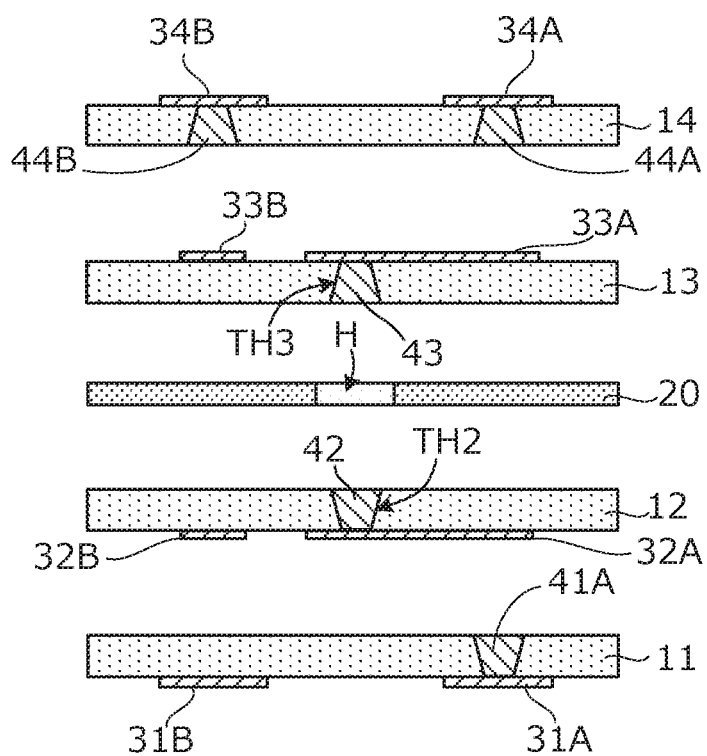
FIG. 3A is a cross-sectional view of a plurality of base material layers before stacking and pressing.
Figure 3B:
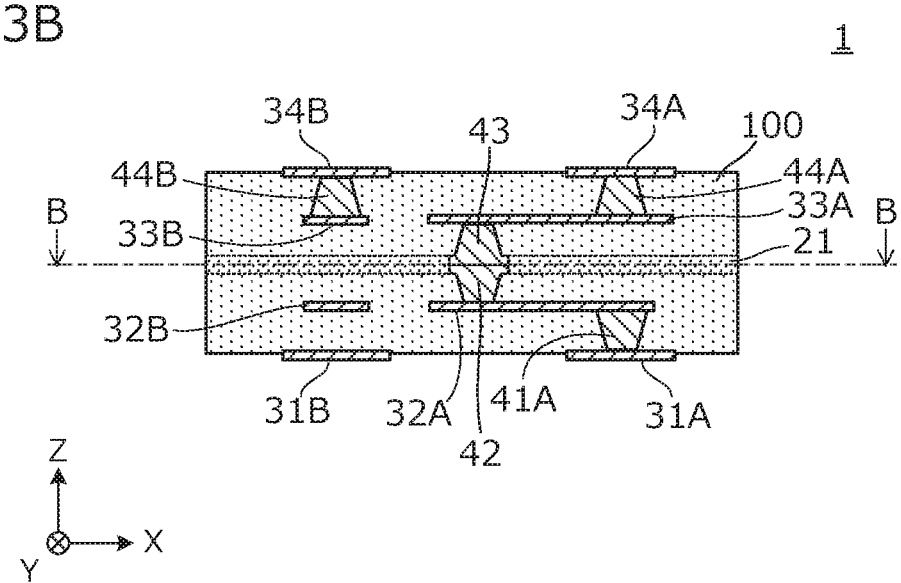
FIG. 3B is a cross-sectional view of the plurality of base material layers after stacking and pressing, which is taken along line A-A in FIG. 1.
Figure 4:
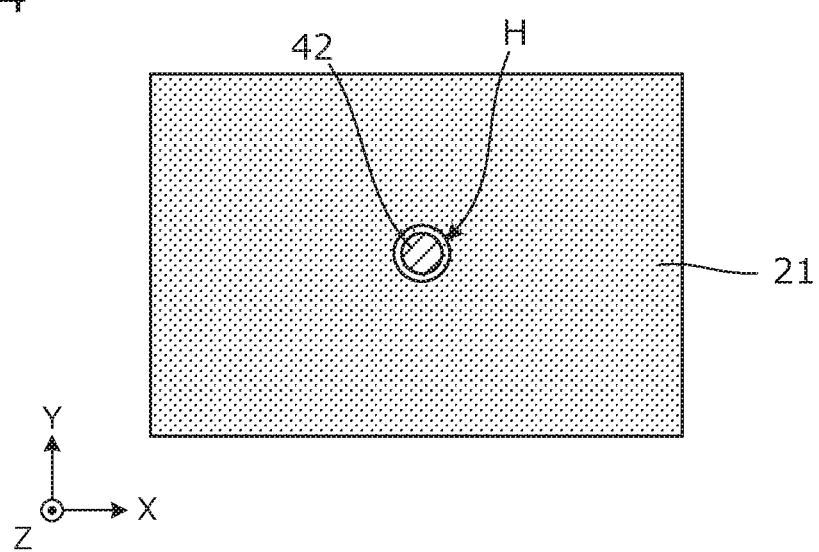
FIG. 4 is a transverse sectional view taken along line B-B in FIG. 3B.

FIG. 1 is a perspective view of a multi-layer substrate according to a first preferred embodiment of the present invention. FIG. 2 is a perspective view of a state of the multi-layer substrate 1 illustrated in FIG. 1 before layers are stacked. FIG. 3A is a cross-sectional view of a plurality of base material layers before stacking and pressing. FIG. 3B is a cross-sectional view of the plurality of base material layers after the stacking and pressing, which is taken along line A-A in FIG. 1. FIG. 4 is a transverse sectional view taken along line B-B in FIG. 3B.

The multi-layer substrate 1 preferably has a rectangular or substantially rectangular flat plate shape and includes a stack of a plurality of base material layers 11, 12, 13, and 14 that are made of an insulating material and an insulation sheet 20. A stacked body 100 is provided by stacking the base material layers 11, 12, 13, and 14 and the insulation sheet 20.

The base material layers 11, 12, 13, and 14 and the insulation sheet 20 are preferably made of, for example, sheets including thermoplastic resin, such as liquid crystal polymer (LCP) as a primary component. Filler such as $SiO_2$ to adjust the linear expansion coefficient, for example, is dispersed in each sheet. However, the filler content rate of the insulation sheet 20 is smaller than the filler content rates of the sheets of the base material layers 11, 12, 13, and 14. Thus, the insulation sheet 20 has higher permeability to gas than that of the base material layers 11, 12, 13, and 14.

Conductor patterns 31A and 31B are provided on a lower surface of the base material layer 11, and conductor patterns 32A and 32B are provided on a lower surface of the base material layer 12. Conductor patterns 33A and 33B are provided on an upper surface of the base material layer 13, and conductor patterns 34A and 34B are provided on an upper surface of the base material layer 14. These conductor patterns are obtained by patterning copper foil. In the present preferred embodiment, each base material layer is preferably, for example, a single-side copper-clad base material layer.

Interlayer connection conductors 41A and 41B are provided in the base material layer 11, and an interlayer connection conductor 42 is provided in the base material layer 12. An interlayer connection conductor 43 is provided in the base material layer 13, and interlayer connection conductors 44A and 44B are provided in the base material layer 14. Each interlayer connection conductor is preferably made of, for example, conductive paste filling a through-hole provided in the base material layer. For example, as illustrated in FIG. 3A, a through-hole TH2 is provided in the base material layer 12 and filled with the conductive paste to provide the interlayer connection conductor 42 in the base material layer 12. Similarly, a through-hole TH3 is provided in the base material layer 13 and filled with the conductive paste to provide the interlayer connection conductor 43 in the base material layer 13.

The conductive paste is preferably, for example, conductive paste including Sn, such as SnCu-based, SnAgCu-based and SnZnBi-based conductive paste, and melts by heating and then solidifies to become interlayer connection conductors in the stacked body.

Among the plurality of base material layers, the base material layer 12 corresponds to a "first base material layer", and the base material layer 13 corresponds to a "second base material layer". The interlayer connection conductor 42 corresponds to a "first interlayer connection conductor", and the interlayer connection conductor 43 corresponds to a "second interlayer connection conductor". The through-hole TH2 corresponds to a "first through-hole", and the through-hole TH3 corresponds to a "second through-hole".

No conductor pattern is provided on the insulation sheet 20. In this example, the insulation sheet 20 is thinner than the base material layers 11, 12, 13, and 14. As illustrated in FIG. 3A, the insulation sheet 20 includes an opening H provided around a connection surface between the interlayer connection conductor 42 and the interlayer connection conductor 43.

Figure 5:
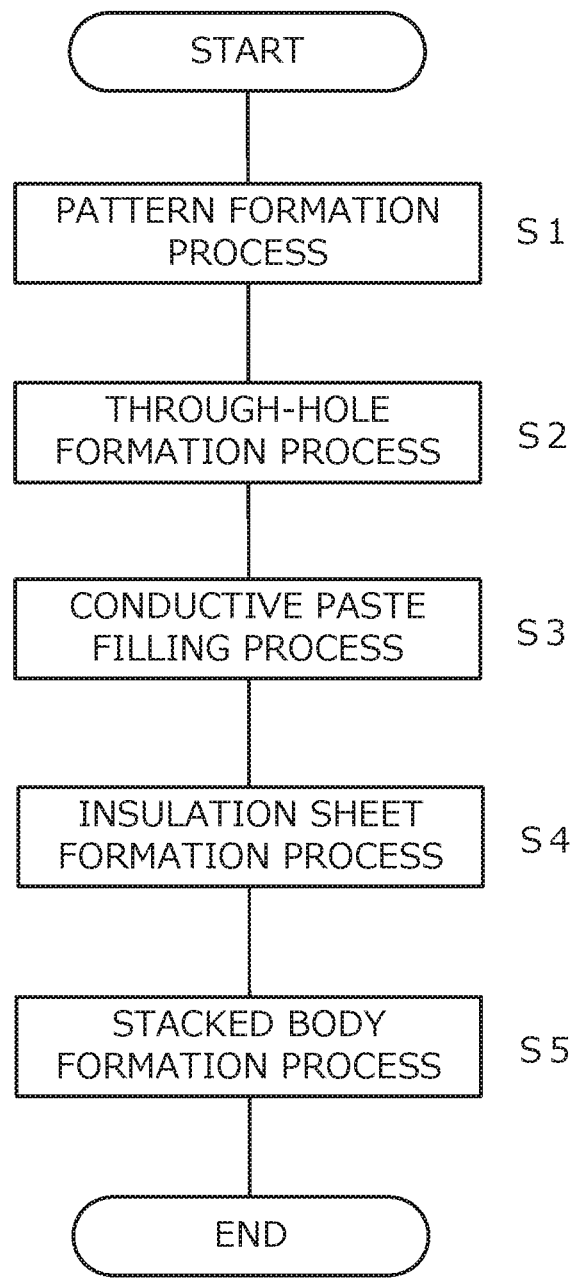
FIG. 5 is a process flowchart illustrating a method of manufacturing the multi-layer substrate 1 according to a preferred embodiment of the present invention.

The following describes a non-limiting example of a method of manufacturing the multi-layer substrate 1 according to a preferred embodiment of the present invention. FIG. 5 is a process flowchart illustrating a method of manufacturing the multi-layer substrate 1. In this example, the multi-layer substrate 1 is manufactured in the order of a pattern formation step S1, a through-hole formation step S2, a conductive paste filling step S3, an insulation sheet formation step S4, and a stacked body formation step S5.

In the pattern formation step S1, a predetermined conductor pattern is formed on a copper-foil-clad liquid crystal polymer sheet by photolithography. In the through-hole formation step S2, through-holes are formed at positions at which interlayer connection conductors are to be formed on the base material layers 11, 12, 13, and 14. In the conductive paste filling step S3, each through-hole is filled with conductive paste by a printing method. In the insulation sheet formation step S4, the opening H is formed at a predetermined position on the insulation sheet 20. In the stacked body formation step S5, the base material layers 11, 12, 13, and 14 and the insulation sheet 20 are stacked and subjected to heat pressing at a predetermined temperature (for example, about 300° C.) in the range of, for example, about 280° C. to about 320° C. inclusive. Accordingly, the multi-layer substrate 1 as illustrated in FIGS. 1 and 3B is obtained. During the heat pressing, the conductive paste is solidified to form interlayer connection conductors. Through this process, conduction and joining are achieved by reaction between a component of the conductive paste and the Cu foil. The insulation sheet 20 illustrated in FIG. 3A becomes an insulating layer 21 in the stacked body 100 through the heat pressing after the stacking.

Although FIG. 5 illustrates the example in which the insulation sheet is formed after the interlayer connection conductors are formed, the step of forming the interlayer connection conductors and the step of forming the insulation sheet only need to be performed before the stacked body formation step, and the order of the step of forming the interlayer connection conductors and the step of forming the insulation sheet is not limited to the stated order.

The first preferred embodiment provides the following advantageous effects.

The opening H of the insulation sheet 20 defines a space for portions at which the interlayer connection conductors are provided, and accordingly, the filling rates of the conductive paste in the holes of the first interlayer connection conductor and the second interlayer connection conductor are decreased. Thus, when gas, such as a volatile component of a solvent included in the conductive paste, is generated from the first interlayer connection conductor and the second interlayer connection conductor, ejection of the conductive paste from the portions at which the first interlayer connection conductor and the second interlayer connection conductor are provided is reduced. This prevents a short-circuit between conductor patterns and unnecessary capacitance from occurring due to the ejected conductive paste, thus achieving a predetermined electrical characteristic. In particular, the conductive paste is likely to be ejected at the junction interface between the interlayer connection conductors without a conductor pattern therebetween, and thus ejection of the conductive paste is effectively reduced when the junction interface between the interlayer connection conductors is surrounded by the opening of the insulating layer.

The diameter of the opening H is larger than the diameters of the interlayer connection conductors 42 and 43 (the inner diameters of the through-holes TH2 and TH3), and thus the filling rate of the conductive paste defining the interlayer connection conductors 42 and 43 into the holes is further decreased, thus further effectively reducing ejection of the conductive paste. In addition, the filling volume of the conductive paste is able to be determined by determining the diameters of the through-holes for the interlayer connection conductors 42 and 43 and the diameter of the opening H in the insulation sheet 20, which leads to a determination of the filling rate of the conductive paste. Moreover, the inside volume of the opening H is also changed by the thickness of the insulation sheet 20, and thus the filling volume of the conductive paste is able to be determined by the thickness of the insulation sheet, which leads to a determination of the filling rate of the conductive paste.

The insulation sheet 20 has greater permeability to gas than that of the base material layers 12 and 13, and thus gas generated from the interlayer connection conductors 42 and 43 is likely to escape, thus further reducing conductive paste ejection.

The insulating layer 21 is exposed at an end surface of the multi-layer substrate 1, and thus gas released from the interlayer connection conductors 42 and 43 escapes in a plane direction through the insulating layer 21, and thus is likely to exit the multi-layer substrate 1. Accordingly, gas is likely to escape from the portions at which the interlayer connection conductors are provided, thus further reducing conductive paste ejection.

The thickness of the insulation sheet 20 is smaller than the thicknesses of the base material layers 11 to 14. Accordingly, the thickness of the multi-layer substrate 1 is reduced. This reduces the height of a chip component including the multi-layer substrate.

The insulation sheet 20 is made of the same base material as those of the base material layers 12 and 13, and thus has a high joining property with the base material layers 12 and 13 and is unlikely to flake or peel off.

The diameter of the opening H is larger than the diameters of the interlayer connection conductors 42 and 43 (the inner diameters of the through-holes TH2 and TH3), and thus a positional difference (stacking difference) between the insulation sheet and each base material layer is able to be managed in the stacked body formation step. In other words, with a predetermined positional accuracy, the interlayer connection conductors are positioned in the opening H of the insulation sheet in plan view, and thus predetermined electrical characteristics of the interlayer connection conductors are able to be maintained.

The opening of the insulating layer includes a place where the interlayer connection conductors overlap with each other in the stacking direction, which relaxes stress concentration on the parts at which the interlayer connection conductors are formed.

No conductor pattern is formed on the insulating layer, and thus no unnecessary coupling with another conductor pattern occurs.

Second Preferred Embodiment

A second preferred embodiment of the present invention describes a multi-layer substrate in which the insulating layer is made of a sheet of a material different from those of the base material layers.

Figure 6A:
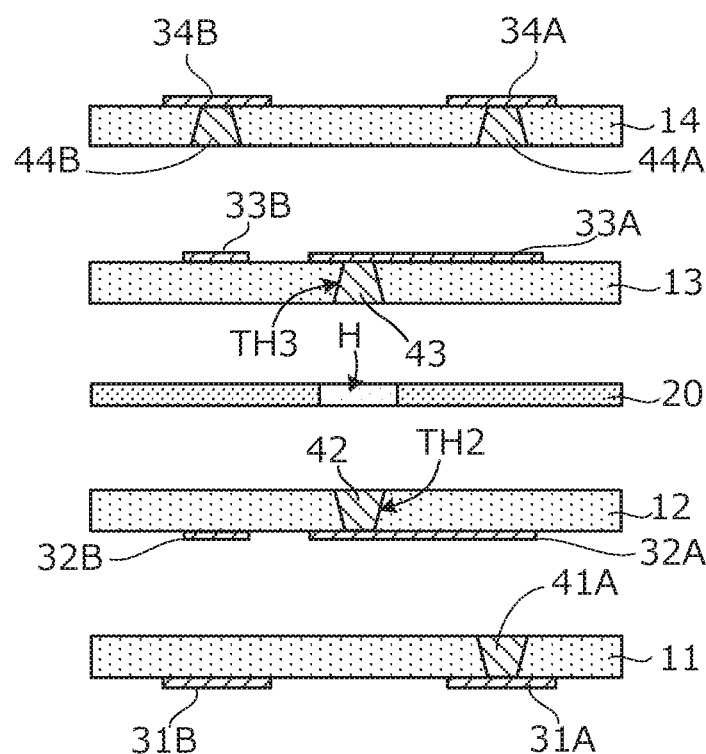
FIG. 6A is a cross-sectional view of a multi-layer substrate 2 according to a second preferred embodiment of the present invention before stacking and pressing of a plurality of base material layers.
Figure 6B:
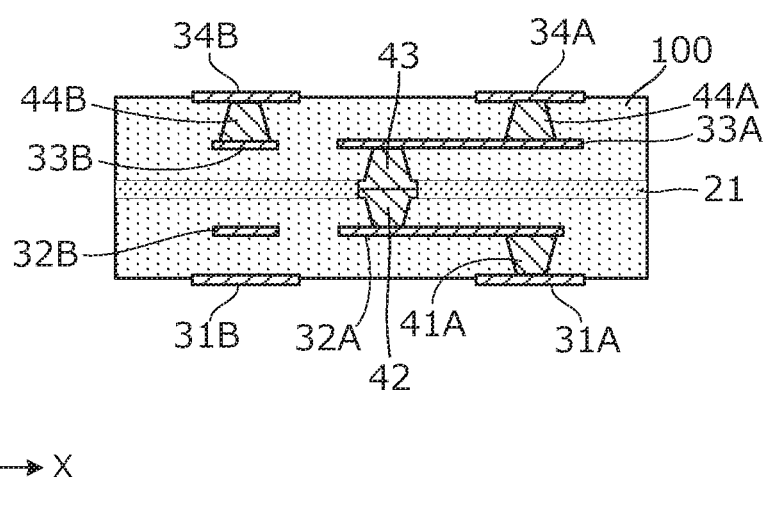
FIG. 6B is a cross-sectional view of the multi-layer substrate 2 after the stacking and pressing.

FIG. 6A is a cross-sectional view of a multi-layer substrate 2 according to the second preferred embodiment before stacking and pressing of the plurality of base material layers. FIG. 6B is a cross-sectional view of the multi-layer substrate 2 after the stacking and pressing. FIGS. 6A and 6B are diagrams corresponding to FIGS. 3A and 3B described in the first preferred embodiment. In the second preferred embodiment, the base material layers 11, 12, 13, and 14 are preferably made of, for example, sheets including thermoplastic resin, such as liquid crystal polymer (LCP) as a primary component. The insulation sheet 20 is preferably made of, for example, a sheet including thermosetting resin, such as polyimide (PI). The remaining configurations are the same or substantially the same as those at described in the first preferred embodiment.

The above-described configuration achieves the same or substantially the same operation and advantageous effects as those of the first preferred embodiment.

The polyimide resin sheet has gas permeability. The following describes the difference in gas permeability between liquid crystal polymer and polyimide. Water vapor permeability was measured by a water vapor permeability testing method prescribed in JIS Z0208. Measurement results were as follows.

Liquid crystal polymer: 0.6 g/m$^2$·24 h
Polyimide: 63.7 g/m$^2$·24 h

As described above, the water vapor permeability of polyimide is about 100 times or more than the water vapor permeability of liquid crystal polymer. This tendency is not limited to water vapor but also applies to gas generated from the conductive paste of the interlayer connection conductors. Thus, the insulating layer made of a polyimide sheet is able to be effectively used as a gas escape portion.

In the present preferred embodiment, gas may escape along the interface between the insulating layer 21 and a base material layer adjacent thereto. Thus, the gas escape effect is greatly improved.

Each of the preferred embodiments described above describes a single-unit component, but a collective substrate including a plurality of element formation units may be subjected to processing at each step (manufactured through a large-size process), and later separated into individual pieces.

Each of the preferred embodiments described above describes an example in which the insulation sheet is stacked together with the base material layers, but the insulation sheet may be formed by application. For example, paste for forming a liquid crystal polymer layer may be applied by printing on the base material layer 12 illustrated in FIG. 3A and dried to volatilize gas in the paste, followed by stacking together with the other base material layers.

The insulating layer may be made of a prepreg sheet including, as a primary component, thermosetting resin that starts curing at a temperature lower than a temperature at which heat pressing is performed. For example, a glass epoxy sheet (epoxy prepreg) may be used.

The multi-layer substrates according to preferred embodiments of the present invention are not limited to substrates on which electronic components are mounted, but may be provided as a chip component by itself. Preferred embodiments of the present invention are applicable to various kinds of electronic components, such as an antenna, an actuator, and a sensor, for example. In this manner, preferred embodiments of the present invention may be appropriately modified without departing from the gist of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multi-layer substrate comprising:
   a first base material layer made of an insulating material;
   a first interlayer connection conductor extending through the first base material layer;
   an insulating layer;
   a second base material layer made of an insulating material and facing the first base material layer across the insulating layer; and
   a second interlayer connection conductor extending through the second base material layer; wherein
   the insulating layer is made of an insulating resin on which no conductor pattern is provided, and includes an opening;
   the first interlayer connection conductor and the second interlayer connection conductor are directly joined with each other inside of the opening;
   the insulating layer has greater permeability to gas than that of the first base material layer and the second base material layer; and
   the multi-layer substrate further includes a third base material layer that is made of a same material as that of the first base material layer and is directly joined with the first base material layer.

2. The multi-layer substrate according to claim 1, wherein a diameter of the opening is larger than a diameter of the first interlayer connection conductor and a diameter of the second interlayer connection conductor.

3. The multi-layer substrate according to claim 1, wherein the insulating layer is exposed at an end surface of a stacked body including a plurality of base material layers including the first base material layer and the second base material layer.

4. The multi-layer substrate according to claim 1, wherein a thickness of the insulating layer is smaller than a thickness of the first base material layer and a thickness of the second base material layer.

5. The multi-layer substrate according to claim 1, wherein the insulating layer is made of a same or substantially a same base material as a base material of the first base material layer and the second base material layer and includes a smaller amount of filler than the first base material layer and the second base material layer.

6. The multi-layer substrate according to claim 1, wherein the first base material layer and the second base material layer each include liquid crystal polymers as a primary component, and the insulating layer includes epoxy or polyimide as a primary component.

7. The multi-layer substrate according to claim 1, wherein the first interlayer connection conductor and the second interlayer connection conductor are made of conductive paste including Sn.

8. The multi-layer substrate according to claim 1, wherein any interlayer connection conductor provided in the multi-layer substrate is disposed in a hole of a base material layer, the hole including a bottom defined by a conductor pattern.

9. The multi-layer substrate according to claim 1, further comprising a third interlayer connection conductor extending through the third base material layer.

10. A multi-layer substrate comprising:
a first base material layer made of an insulating material;
a first interlayer connection conductor extending through the first base material layer;
an insulating layer;
a second base material layer made of an insulating material and facing the first base material layer across the insulating layer;
a second interlayer connection conductor extending through the second base material layer; and
a plurality of insulating layers including the first base material layer, the insulating layer, and the second base material layer; wherein
the insulating layer is made of an insulating resin on which no conductor pattern is provided, and includes an opening;
the first interlayer connection conductor and the second interlayer connection conductor are directly joined with each other inside of the opening; and
the insulating layer has greater permeability to gas than that of any other insulating layer of the plurality of insulating layers that is an inner layer of the multi-layer substrate and does not include an opening in which any interlayer connection conductors are directly joined with each other.

11. The multi-layer substrate according to claim 10, wherein a diameter of the opening is larger than a diameter of the first interlayer connection conductor and a diameter of the second interlayer connection conductor.

12. The multi-layer substrate according to claim 10, wherein the insulating layer is exposed at an end surface of a stacked body including a plurality of base material layers including the first base material layer and the second base material layer.

13. The multi-layer substrate according to claim 10, wherein a thickness of the insulating layer is smaller than a thickness of the first base material layer and a thickness of the second base material layer.

14. The multi-layer substrate according to claim 10, wherein the insulating layer is made of a same or substantially a same base material as a base material of the first base material layer and the second base material layer and includes a smaller amount of filler than the first base material layer and the second base material layer.

15. The multi-layer substrate according to claim 10, wherein the first base material layer and the second base material layer each include liquid crystal polymers as a primary component, and the insulating layer includes epoxy or polyimide as a primary component.

16. The multi-layer substrate according to claim 10, wherein the first interlayer connection conductor and the second interlayer connection conductor are made of conductive paste including Sn.

17. The multi-layer substrate according to claim 10, wherein any interlayer connection conductor provided in the multi-layer substrate is disposed in a hole of a base material layer, the hole including a bottom defined by a conductor pattern.

* * * * *